(12) United States Patent
Cronin et al.

(10) Patent No.: US 6,429,473 B1
(45) Date of Patent: *Aug. 6, 2002

(54) DRAM CELL WITH STACKED CAPACITOR SELF-ALIGNED TO BITLINE

(75) Inventors: John Edward Cronin, Milton; Carter Welling Kaanta, Colchester; Brian John Machesney, Burlington, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/690,629

(22) Filed: Jul. 30, 1996

(51) Int. Cl.⁷ .................. H01L 27/108; H01L 29/76; H01L 29/94; H01L 31/119

(52) U.S. Cl. ........................ 257/296; 257/309

(58) Field of Search ................. 257/296, 301, 257/302, 303, 304, 305, 306, 307, 308, 309

(56) References Cited

U.S. PATENT DOCUMENTS

| | | | |
|---|---|---|---|
| 4,826,781 A | 5/1989 | Asahini et al. | 437/41 |
| 5,001,526 A | 3/1991 | Gotou | 357/23.6 |
| 5,155,056 A | 10/1992 | Jeong-Gyoo | 437/47 |
| 5,236,855 A | 8/1993 | Dennison et al. | 437/47 |
| 5,236,860 A | 8/1993 | Fazan et al. | 437/52 |
| 5,240,871 A | 8/1993 | Doan et al. | 437/47 |
| 5,262,343 A | 11/1993 | Rhodes et al. | 437/52 |
| 5,262,662 A | 11/1993 | Gonzales et al. | 257/307 |
| 5,266,513 A | 11/1993 | Fazan et al. | 437/52 |
| 5,292,677 A | * 3/1994 | Dennison | 437/52 |
| 5,629,539 A | * 5/1997 | Aoki et al. | 257/306 |
| 5,663,585 A | * 9/1997 | Lee et al. | 257/296 |
| 5,804,853 A | * 9/1998 | Cronin et al. | 257/309 |
| 5,856,704 A | * 1/1999 | Schuele | 257/754 |
| 5,864,156 A | * 1/1999 | Juengling | 257/306 |
| 5,955,758 A | * 9/1999 | Sandhu et al. | 257/306 |

FOREIGN PATENT DOCUMENTS

CA 1306072 8/1992

OTHER PUBLICATIONS

IBM Technical Disclosure Bulletin, vol. 23, No. 12, May 1981, pp. 5346&5347 Title: Hole Opening in Polysilicon by Selective Doping and Removal Technique.

* cited by examiner

Primary Examiner—Ngân V. Ngô
(74) Attorney, Agent, or Firm—Mark F. Chadurjian; James M. Leas

(57) ABSTRACT

A semiconductor chip with uniform topology includes a memory cell having a stacked capacitor self-aligned with a bitline. Thick insulation on the bitline and on interconnect wiring on supports circuits of the chip serves to provide the uniform topology and to provide for the self-alignment of the capacitor and bitline. Bitlines and support circuit interconnect wiring are both formed from the same level of metal but they are patterned in separate masking steps. The stacked capacitors are separated from each other by less than the minimum dimension of the photolithographic system used for fabrication.

17 Claims, 16 Drawing Sheets

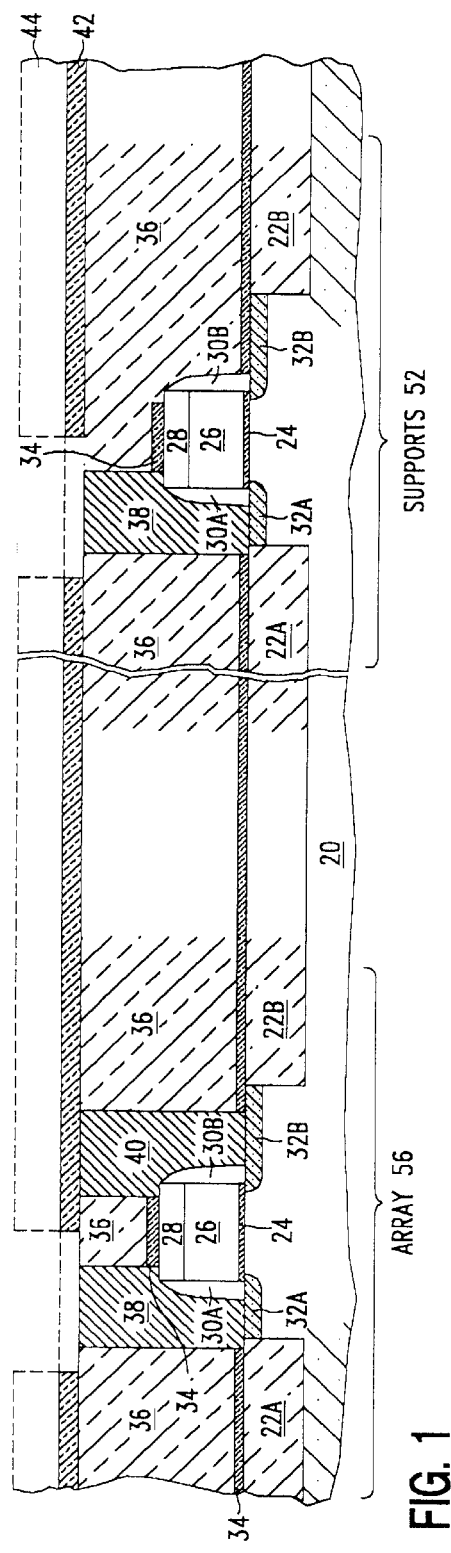
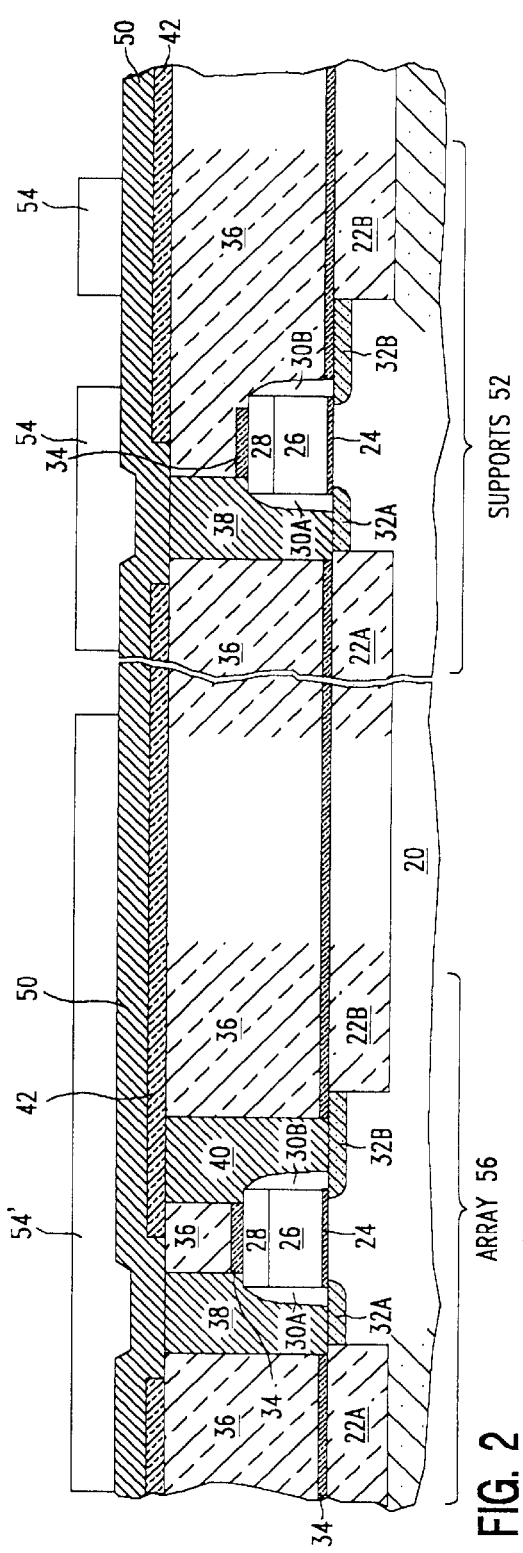
FIG. 1
FIG. 2

ARRAY 56

US 6,429,473 B1

DRAM CELL WITH STACKED CAPACITOR SELF-ALIGNED TO BITLINE

FIELD OF THE INVENTION

This invention generally relates to stacked capacitors for integrated circuit chips. More particularly, it relates to a DRAM cell structure and a method for fabrication thereof in which a stacked capacitor is self-aligned to the underlying bitline.

BACKGROUND OF THE INVENTION

Stacked capacitors have been extensively used for charge storage in high density DRAM cells. One type of stacked capacitor is a stud stacked capacitor in which a polysilicon stud is defined, coated with dielectric, and then the dielectric is coated with a conformal layer of polysilicon. Other stacked capacitors have multiple planar layers or vertical cylinders of polysilicon separated by oxide. While stacked capacitors provide advantages for DRAM cells they suffer from several problems. First, there is the problem of overlay mismatch between capacitor plate and node diffusion which can lead to high contact resistance. Second, stacked capacitors have very uneven topography in the array region, making subsequent processing steps, such as photolithography difficult. Third, contact between bitline and bitline diffusion through thick oxide encapsulating the stacked capacitor is difficult. Fourth, photolithographic misalignment of the stacked capacitor to underlying structures contributes to chip to chip variation of the size and capacitance of the stacked capacitor. Fifth, the vertical dimension of the stacked capacitor is limited by the ability to tolerate the topology it contributes and the planar area of the stacked capacitor is limited by the dimensions of the cell. Finally, stacked capacitors pose the need for additional masks to provide the node and bitline contacts.

Thus, a better solution is needed that provides improved overlay between capacitor plate and node diffusion, improved overlay between capacitor plate and bitline, simplified contact to bitline and node diffusions, the ability to extend more vertically while retaining smooth topology, less variation in capacitance among cells, better use of cell area, and all without additional masks. This solution is provided by the following invention.

SUMMARY OF THE INVENTION

It is therefore an object of the present invention to provide a DRAM cell stacked capacitor self-aligned to a bitline It is another object of the present invention to provide a DRAM chip having uniform topology in array and supports circuits portions of the chip to facilitate processing of subsequent wiring levels.

It is another object of the present invention to provide a stacked capacitor occupying nearly all of the area of a cell.

It is a feature of the present invention that portions of a single level of metallization are patterned in separate masking steps.

It is an advantage of the present invention that the stacked capacitor can occupy substantially all the area of a cell except that taken by isolation having a dimension substantially less than the minimum dimension of the photolithographic system used in the fabrication process.

These and other objects, features, and advantages of the invention are accomplished by a method of forming a connector, comprising the steps of: depositing a conductive layer; patterning at least portions of the conductive layer; forming an insulating layer on the conductive layer; and patterning at least portions of the insulating layer and the conductive layer.

Another aspect of the invention is a DRAM cell structure, comprising a stacked capacitor self-aligned to a bitline.

BRIEF DESCRIPTION OF THE DRAWINGS

The foregoing and other objects, features, and advantages of the invention will be apparent from the following detailed description of the invention, as illustrated in the accompanying drawings, in which:

FIGS. 1–7, 8a, and 9–10 and 11a are cross sectional views showing a sequence of process steps to fabricate array and supports devices and stacked capacitors of the present invention. The cross section through the array device is taken along line A, B, C, . . . J found in the top view of an array portion of a chip shown in FIG. 11b. The cross section through the supports device is a similar broken cross section.

FIGS. 4', 5', and 6' are cross sectional views showing the sequence of process steps instead of those used in FIGS. 4, 5, and 6 to fabricate an enhanced version of the present invention having a larger stacked capacitor that extends over the bitlines.

FIG. 11b' is a top view of the layout of the array portion of the enhanced version of the chip of the present invention in which stacked capacitors extend over the bitline and the stacked capacitors are separated from each other in the direction parallel to the wordline by a distance that is less than the minimum photolithographic dimension.

DETAILED DESCRIPTION OF THE INVENTION

Figure 3:
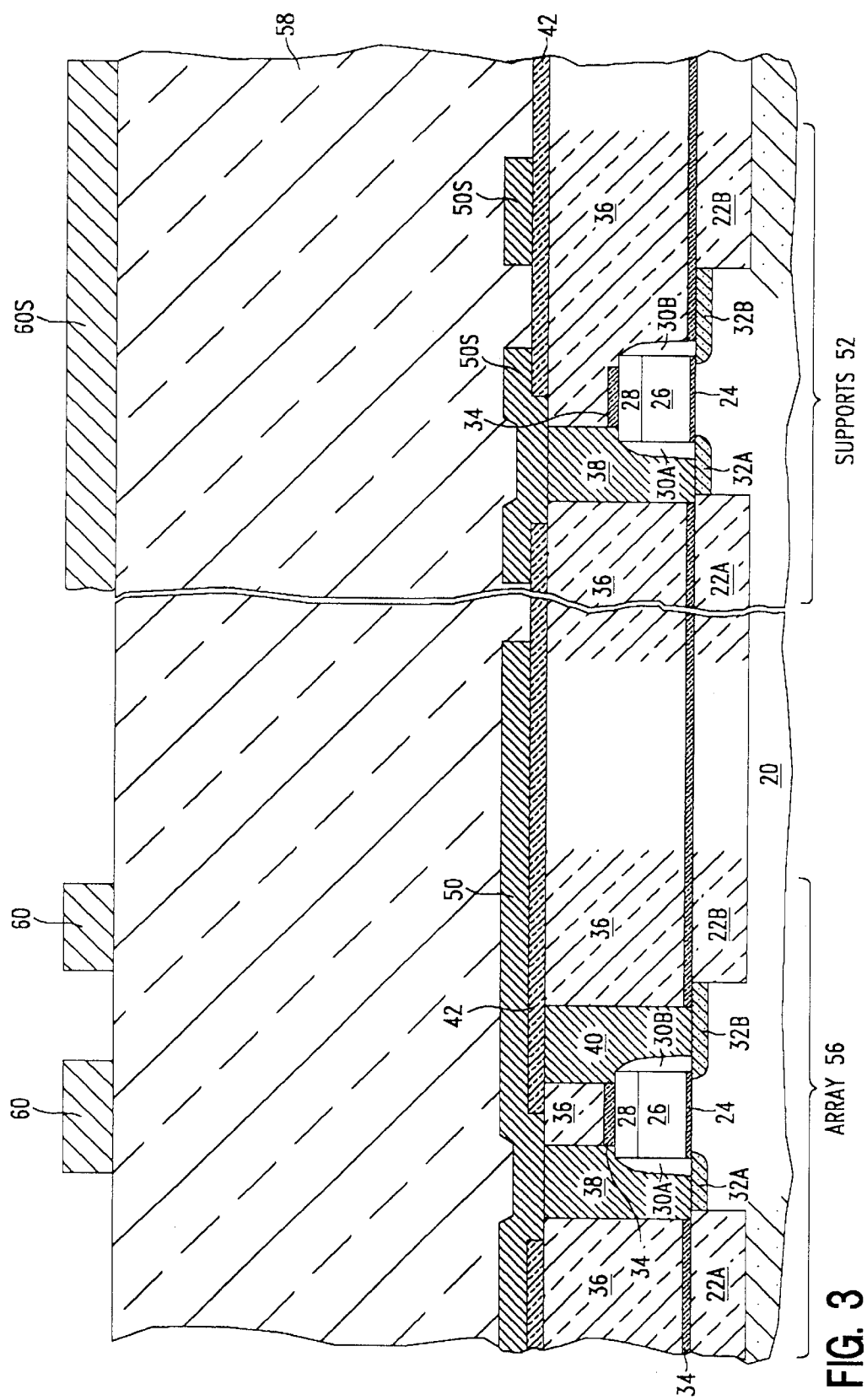

The present invention provides improved overlay between stacked capacitor plate and node diffusion, smooth topology, and simplified contact to bitline and node diffusions while avoiding additional masks. The invention takes advantage of a process disclosed in patent application Ser. No. 08/540,387 to Debrosse et al. to assure that insulation remains on the bitline stud when the node stud is opened for contact. The invention provides advantage over the process therein disclosed by providing stacked capacitors self-aligned to the bitlines and by providing a structure with uniform topology over array and supports regions.

Prepositions, such as "on" and "higher" are defined with respect to the planar semiconductor surface of a chip or wafer, regardless of the orientation the structure is actually held. A layer is on another layer even if there are intervening layers.

As used in this application the phrase, the capacitor is "self-aligned" with the bitline means that a single masking step is used for fabricating both. The edge of the capacitor may be defined by the edge of the bitline. Alternatively, the capacitor and the bitline may both be defined by the same photolithographic edge. It is understood that the capacitor or bitline may be defined by an edge, such as a spacer edge, that was derived from that original photolithographic edge. The key is that separate photolithography steps for the two structures are avoided; both structures are formed in a location derived from a single masking step. Thus, there is no mask alignment tolerance spacing between the two structures. In addition to spacers, such processes as etches, lateral implant straggle, diffusion, and other process steps may of course make the two structures move out of actual alignment, but they are still considered to be "self-aligned" to the common original photolithographic mask edge and "self-aligned" with each other since their positions were derived from a common mask edge and not determined by separate masks.

FIG. 1 is a cross-sectional view depicting steps in the process of fabricating transistors in the array and supports regions of a chip, and stud connectors to the transistors, before fabricating the stacked capacitor cell of the present invention. The process is similar to that described in U.S. patent application Ser. No. 08/540,387 to Debrosse et al., incorporated herein by reference.

Substrate 20 is formed of a semiconductor, such as silicon, germanium, or gallium arsenide. In the first step, shallow trench isolation (STI) regions 22A and 22B are prepared by first etching trenches in desired areas within substrate 20. STI regions 22A and 22B are then filled with an insulating material such as CVD-deposited silicon dioxide, and planarized.

Information regarding specific details of STI is readily available in the art, e.g., see the article by B. Davari et al in the 1988 IEDM 88 Technical Digest, Cat. No. 88 CH2528-8, p. 92–95. In addition, other conventional types of isolation are possible for the base of a stacked capacitor cell, including LOCOS isolation, well known in the art.

Gate oxide layer 24 is formed next, usually by thermal oxidation of substrate 20. Gate oxide layer 24 typically has a thickness in the range of about 50 to about 200 Angstroms.

Following formation of gate oxide 24, blanket layers of polysilicon about 2500 A thick and silicon nitride about 1000 A thick are deposited for word line 26 and insulating cap 28, respectively. Wordline 26 could alternatively be formed of a refractory metal such as tungsten or molybdenum on a layer of polysilicon to provide lowered electrical resistance. The low resistance layer could also be formed of an alloy of a refractory metal with another material, such as silicon, to provide, for example, molybdenum, tantalum, or tungsten disilicide. Blanket layers for wordline 26 can be formed by any conventional technique, such as chemical vapor deposition (CVD), low temperature-CVD, plasma-enhanced CVD (PECVD), evaporation, and the like. Like the conductive portion of the word line stack, nitride cap layer 28 is advantageously deposited as a blanket layer over all of the exposed surfaces using a process such as CVD. Cap and word line layers are then masked and etched to form the appropriate shape for individual wordlines 26.

After capped wordlines 26, 28 are defined by the etch step, a blanket silicon nitride layer is then deposited having a thickness from about 500 to about 1000 A. A directional etching step, using RIE, for example, removes all portions of this layer from horizontal surfaces, leaving spacers 30A and 30B along sidewalls of wordlines 26. Thus, insulating cap layer 28 and spacers 30A and 30B insulate wordline 26 from other conductive regions of the structure, such the bitline and capacitor studs described below.

Next, diffusion regions 32A and 32B are formed. Diffusion regions 32A and 32B serve as the source and drain of a conventional metal oxide semiconductor field effect transistor (MOSFET), with the portion of wordline 26 located on thin oxide 24 serving as the gate. Techniques for forming diffusion regions 32A and 32B are well known in the art and include ion implantation.

Passivation layer 34 is next applied. Passivation layer 34 is preferably formed of a material such as silicon nitride and is relatively thin, for example, about 500 to about 1000 Angstroms. Passivation layer 34 coats the entire surface, including all surfaces of spacers 30A and 30B and cap 28 of word line 26 and adjacent diffusions 32A and 32B. Passivation layer 34 prevents ionic materials from entering gate oxide regions and STI-oxide regions and serves as an etch stop during a subsequent processing step. Standard methods are used to apply nitride passivation layer 34, such as CVD.

Thick insulating layer 36, formed of a material such as silicon dioxide, is then deposited by conventional techniques, such as CVD or low temperature CVD. Then, insulating layer 36 is planarized by chemical-mechanical polishing (CMP). CMP is described in U.S. Pat. Nos. 5,292,689, 5,234,868, 4,944,836, and 4,910,155, all of which are incorporated herein by reference. As planarized, layer 36 has a thickness in the range of about 3000 to about 15,000 Angstroms, although this thickness will depend in part on the designed size of the STC cell and on the spacing required to reduce capacitive coupling between substrate 20 and a bitline to be formed in a subsequent step.

In the next step, a mask (not shown) is used to define two vias through thick insulating region 36, followed by conventional etching procedures to bring the vias to the depth of nitride passivation layer 34 over diffused regions 32A and 32B. Exposed portions of nitride passivation layer 34 are then removed using a standard directional etch for a specified time. The deposition and directional etch of passivation layer 34 may leave spacers 30A, 30B somewhat thicker, while exposed portions of cap 28 may become slightly thinner. Following removal of the mask, a conductive material is deposited to simultaneously contact both diffusions 32A, 32B and fill both vias. The conductive material is then planarized to form studs 38 and 40, contacting diffusions 32A and 32B respectively, that are coplanar with thick insulating layer 36. The conductive material is usually doped polysilicon but it may also be a refractory metal or metals, such as a sandwich of titanium/titanium nitride/tungsten, or a metal alloy.

Metallization techniques for preparing features like metallic studs are well-known in the art and described, for example, in *VLSI Technology,* 2nd Edition, S. M. Sze, 1988, McGraw-Hill Publishing Company. (Chapter 9 of this reference relates specifically to this topic, but the entire content of the Sze text is generally relevant). Metal deposition can be carried out by known techniques, such as CVD, sputtering, evaporation, and the like.

Studs 38 and 40 are formed in both array region 56 and supports region 52. In supports region 52 contacts are made to both studs in a later step. However, because stud 40 in supports region 52 is in a plane other than that of stud 38 in the illustrative cross sections, and for simplicity of showing the wiring connection to studs 38 and 40 in FIG. 2, stud 40 in supports region 52 is not visible.

The dimensions of studs 38 and 40 will depend on the photolithographic system available for the particular generation of STC cell being manufactured. Each stud has a width that is approximately the minimum dimension of that photolithographic system. The height of studs 38, 40 should be at least equal to the height of capped wordline 26. As an illustration, the height of studs 38, 40 for an STC cell of a 256 megabit DRAM will be in the range of about 3000 to about 10,000 Angstroms, while its width will be in the range of about 2000 to about 4000 Angstroms. Preferred dimensions for the 256 megabit chip are 8000 Angstrom height and 2500 Angstrom width. The upper surfaces of studs 38 and 40 are usually planarized by a technique such as CMP mentioned hereinabove.

Stud differentiation layer 42 is then applied over the exposed surface of studs 38 and 40 and insulating region 36. Stud differentiation layer 42 has a thickness of about 500 to 1000 Angstroms for the 256 megabit DRAM size mentioned above. Stud differentiation layer 42 is typically formed of silicon dioxide, but it could also be formed of various other materials, such as silicon nitride or a composite of silicon oxide and silicon nitride. Stud differentiation layer 42 is deposited by the usual techniques, such as CVD.

Stud differentiation layer 42 is then patterned with stud differentiation mask 44 and etched to open contact to bitline stud 38 while leaving capacitor stud 40 covered as shown in FIG. 1. Stud differentiation mask 44 and layer 42 will ensure that later formed bitline 50a contacts bitline stud 38, but does not contact capacitor stud 40. Stud differentiation layer 42 should be thick enough to reduce parasitic capacitance between bitline 50a (FIG. 4) and capacitor stud 40, but thin enough to permit easy etching.

In the next step, a thin blanket layer of bitline conductor 50 is deposited as shown in FIG. 2. Bitline conductor 50 is typically only about 1000 A thick to minimize bitline to bitline capacitance. It is preferably formed of a refractory metal or a layered structure, such as titanium/titanium nitride/tungsten, as described in commonly assigned Canadian Patent 1,306,072, or it may be formed of a refractory metal-silicide, so as to avoid electromigration concerns. Bitline conductor 50 is deposited by a technique, such as CVD, in which the conductor or conductors are blanket deposited over the entire surface. Bitline metallization 50 contacts bitline stud 38 where stud differentiation layer 42 is open. It does not contact capacitor stud 40, which is protected by stud differentiation layer 42.

In the next step, that part of bitline metallization 50 that is used in the logic supports portion 52 of the DRAM chip is patterned in a masking step using mask 54 having block mask portion 54'. In this step, block mask portion 54' remains completely intact over array portion 56 of the chip in order to avoid removing any portions of bitline metallization 50 that are located on array portion 56, as shown in FIG. 2.

As shown in FIG. 3, bitline metallization 50 is then etched using a standard CVD tungsten etchant, such as $Cl_2+O_2$ or $SiF_4+O_2$, to form interconnects 50S in the supports portion of the chip while leaving blanket metallization 50 in the array portion of the chip. Thick insulator 58, formed from a material such as silicon dioxide, is then deposited and planarized by chemical mechanical polishing. Thick insulator 58 is deposited with a thickness set to provide the height needed for later formed stacked capacitors, typically at least 1 um.

Figure 4:
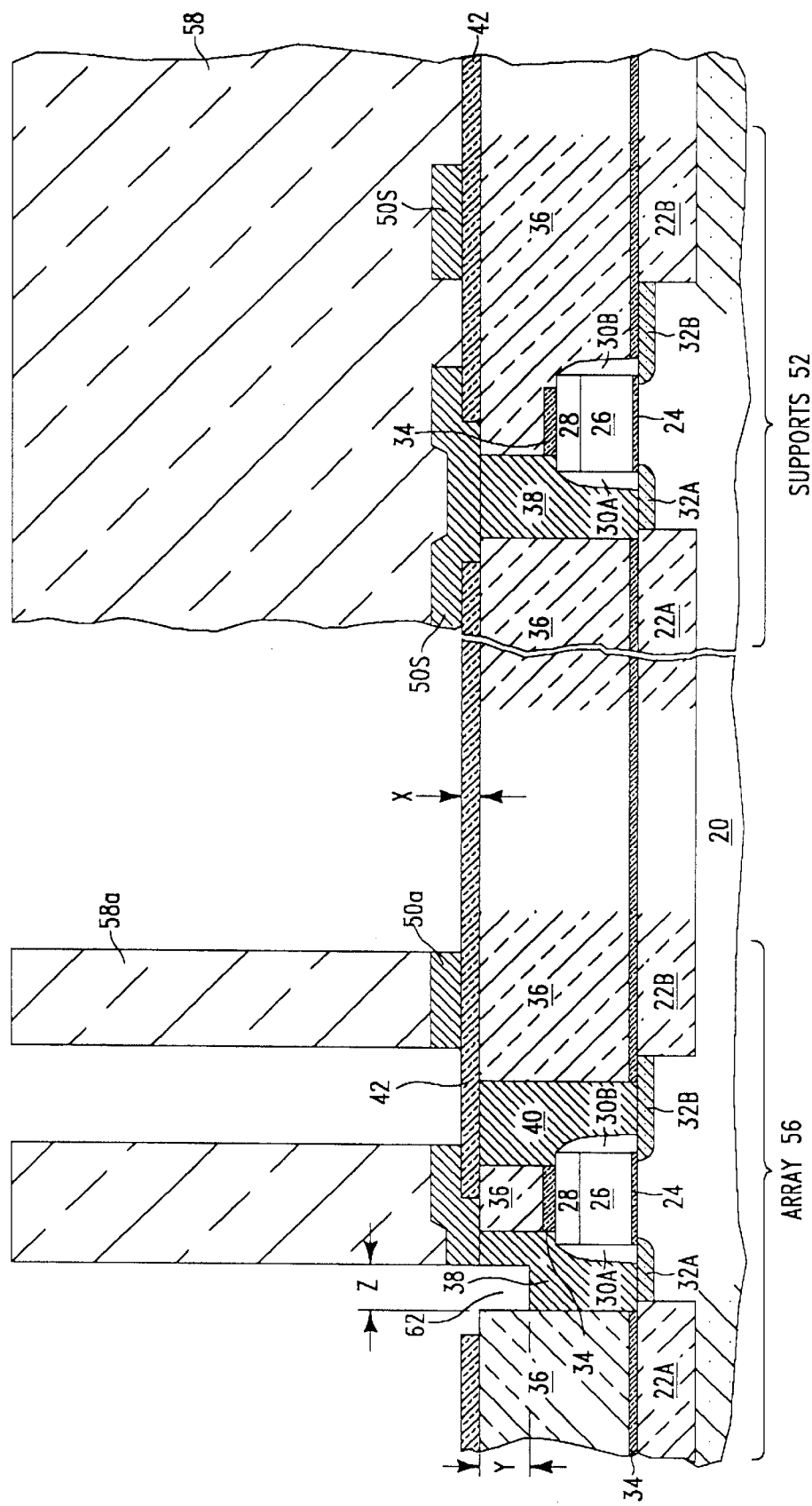
Figure 4:
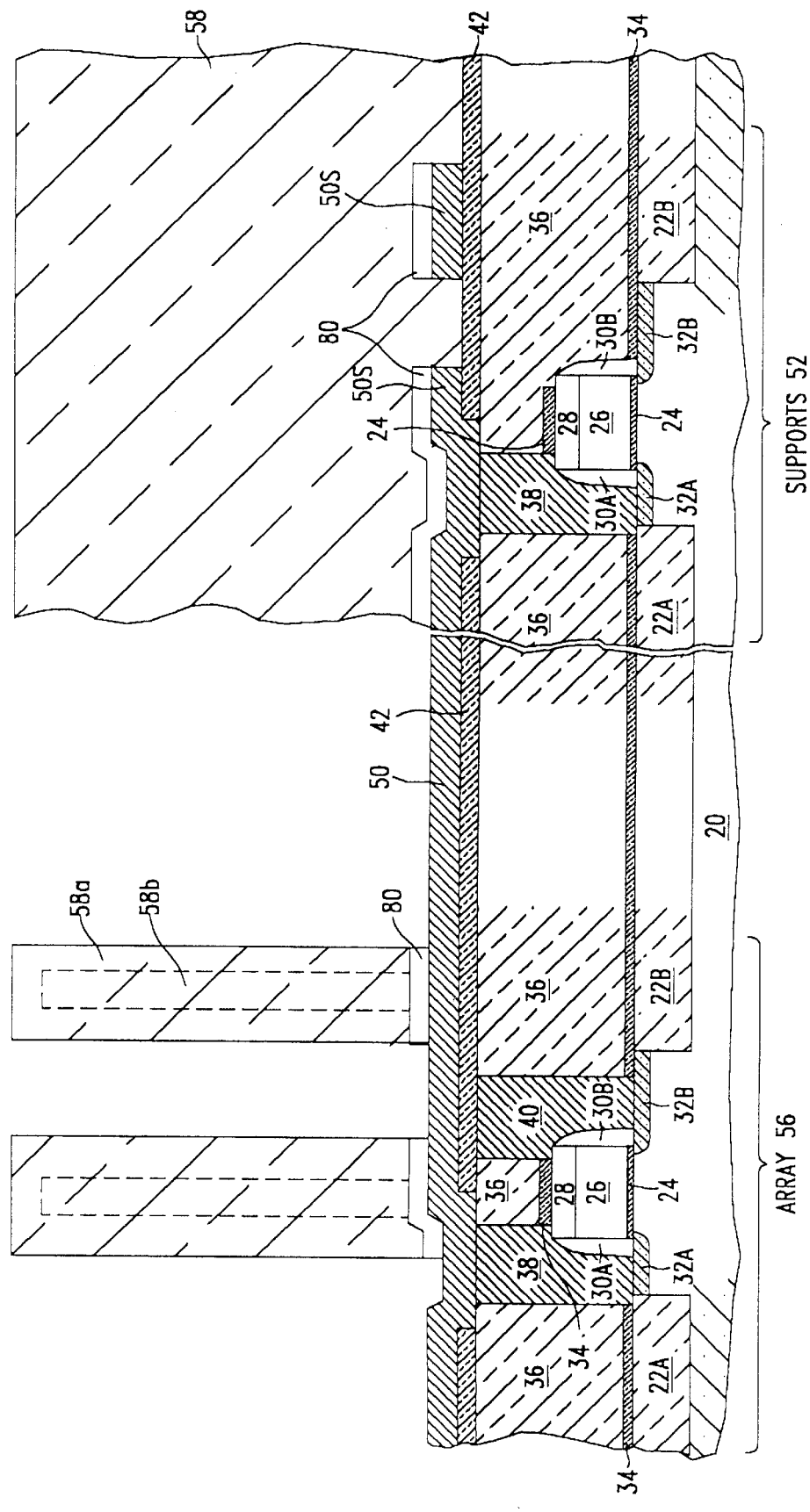

Next, mask 60 having block mask portion 60S is provided to define that portion of bitline metallization 50 that is in array portion 56 of the chip while completely blocking supports portion 52 of the chip. In this step, block mask portion 60S remains completely intact over supports portion 52 of the chip in order to avoid removing any portions of thick insulator 58 that are located on supports portion 52, as shown in FIG. 3. Using mask 60 of FIG. 3, thick insulator 58 is directionally etched in array portion 56, as shown in FIG. 4 to produce thick insulating pedestals 58a, stopping on bitline metallization 50. Mask 60 is then removed. Then, using a standard CVD tungsten etchant, such as $Cl_2+O_2$ or $SiF_4+O_2$, that does not attack underlying silicon dioxide layer 42, the directional etch continues to pattern bitlines 50a in array portion 56 of the chip. This directional etch is further continued to etch all portions of bitline stud 38 thereby exposed, forming recess 62 in bitline stud 38.

As described above, and illustrated in FIG. 5, during the patterning of thick insulator 58 and bitline 50a, bit-line stud recess 62 is purposefully formed. The presence of the recess is a critical aspect of the present invention because, in a later process step, it will provide means to insulate bitline stud 38 while capacitor stud 40 is opened, all without the need for an extra masking step.

The depth of recess 62 (dimension "Y" in FIG. 4) must be greater than the thickness of stud differentiation layer 42 (dimension "X" in FIG. 4). This ensures that when layer 42 and the bitline spacer layer described below (FIG. 5) are subsequently removed, a protective insulating layer will remain in recess 62. This remaining insulating layer prevents undesirable contact between bit-line stud 36 and an overlying storage capacitor node during subsequent manufacturing steps. In preferred embodiments, the depth of the recess is at least 100% greater than the thickness of layer 42.

Bitline insulator 64 is then applied over all of the exposed regions, including edges of bitlines 50a and sidewalls of thick insulating pedestals 58a. Bitline insulator 64 is formed of a material, such as silicon dioxide, and is deposited by conventional methods, such as CVD. It is usually relatively thin, about 200 Angstroms to about 500 Angstroms for the exemplary 256 Mb DRAM size specified previously. It is deposited to a sufficient thickness to completely fill recess 62, the required thickness being about half of the maximum possible width Z of recess 62. The maximum possible width (dimension "Z" in FIG. 4) of recess 62 is determined by the overlay tolerance of mask 60 with bitline stud 38. The overlay tolerance is typically less than 0.5 times the minimum photolithographic dimension. Thus, the required thickness of bitline spacer 64 to completely fill recess 62 is less than 0.25 times the minimum photolithographic dimension. Thus, for the case of the 256 Mb chip, where the minimum dimension is about 0.25 um, dimension Z is less than about 1200 A, and bitline insulator 64 can be less than about 600 A thick. Of course, sputter etching during deposition could be used to assist filling recess 62, reducing the required thickness of bitline insulator 64 even more. Sputter etching while filling gaps during deposition is a process well known in the art.

Figure 5:
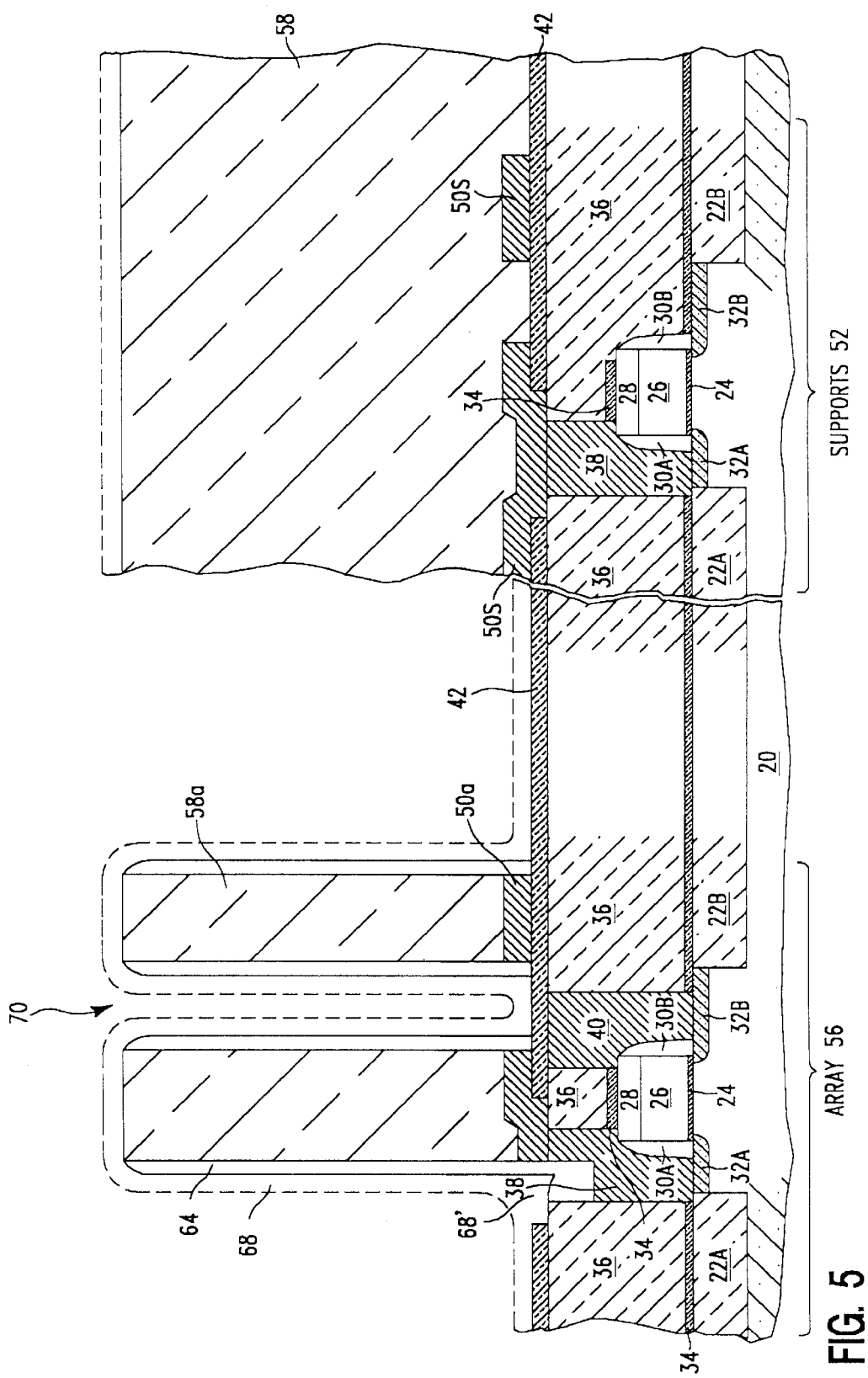
Figure 5:
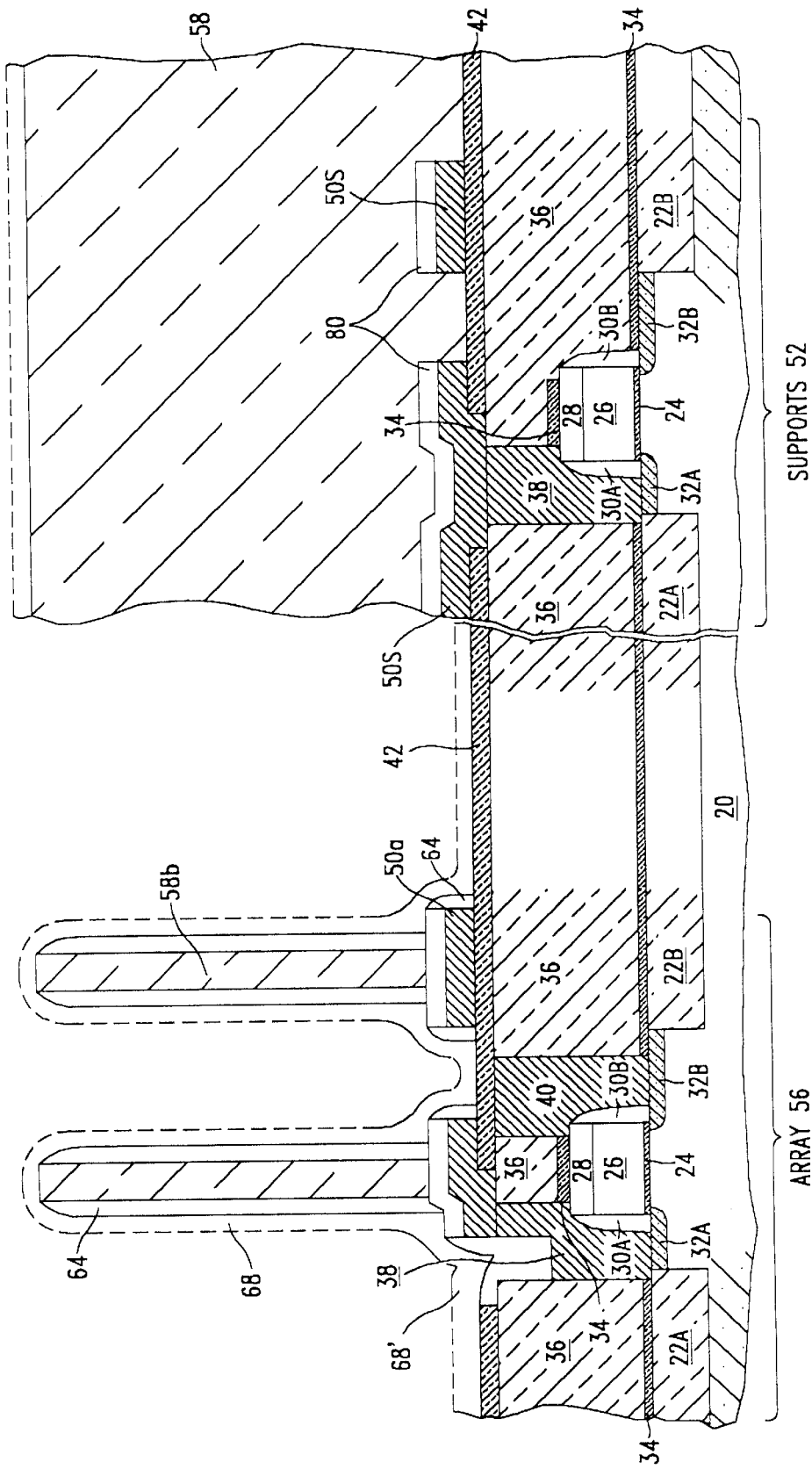

Bit-line insulator 64 is then etched isotropically, removing layer 68 from all surfaces uniformly, including surface 68' of insulator filling recess 62, as shown in FIG. 5. It is worth noting that recess 62 was filled as layers were deposited on both sides of recess 62. By contrast, the isotropic etch removes material only from the top surface of recess 62. If the original depth Y of recess 62 is much greater than the amount etched, a large amount of insulator will remain on top of bitline stud 38. In other words, while a relatively thin layer of bitline insulator 64 is sufficient to ensure that recess 62 is filled, the thickness of insulator 64 can be reduced during the subsequent isotropic etch while still leaving a thick layer of insulator 64 in recess 62 to insulate bit line stud 38.

The isotropic etch reduces the thickness of insulator 64 so as to increase space 70 between thick insulating pedestals 58a for stacked capacitors to be formed in a later step.

Figure 6:
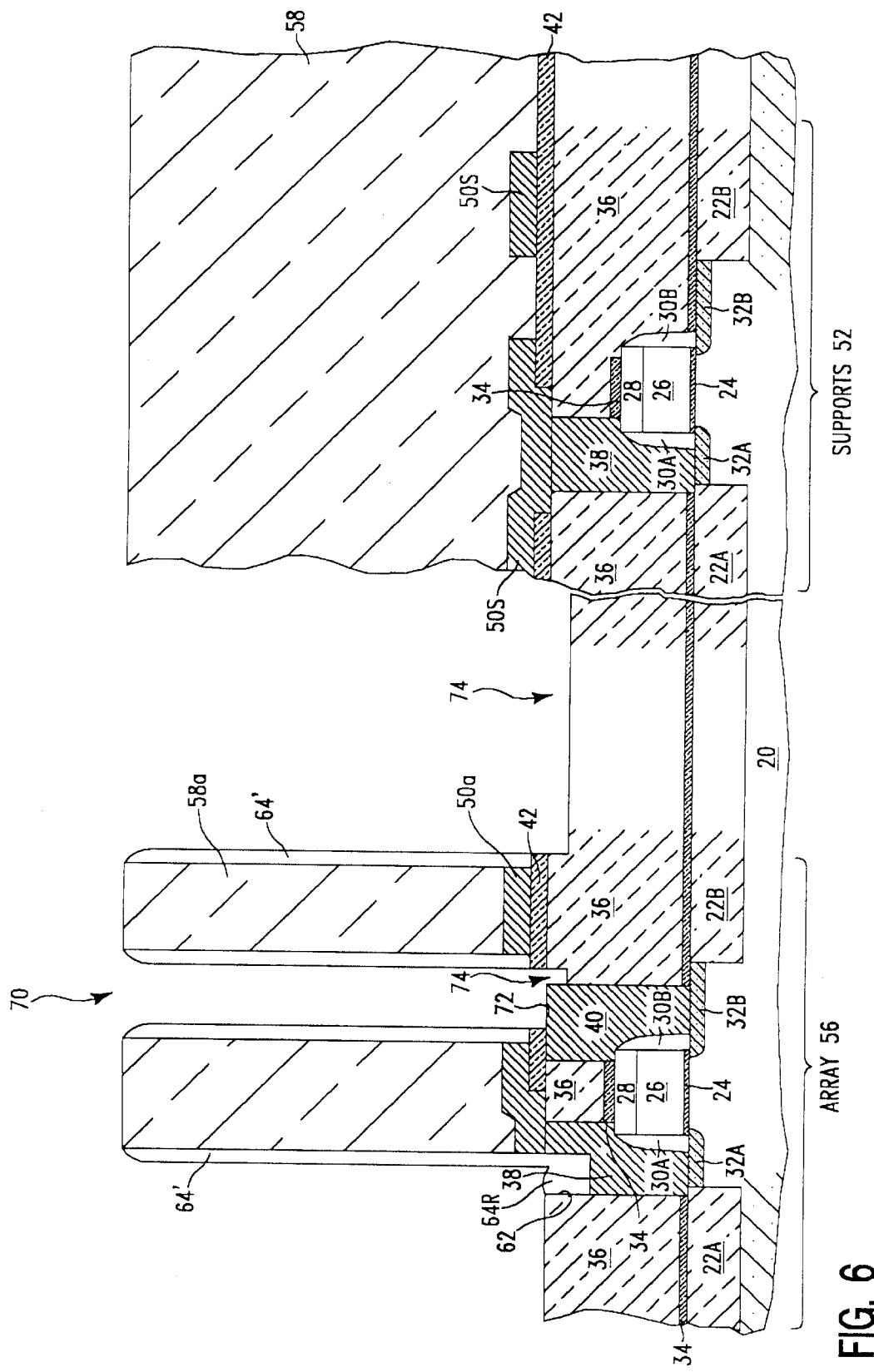
Figure 6:
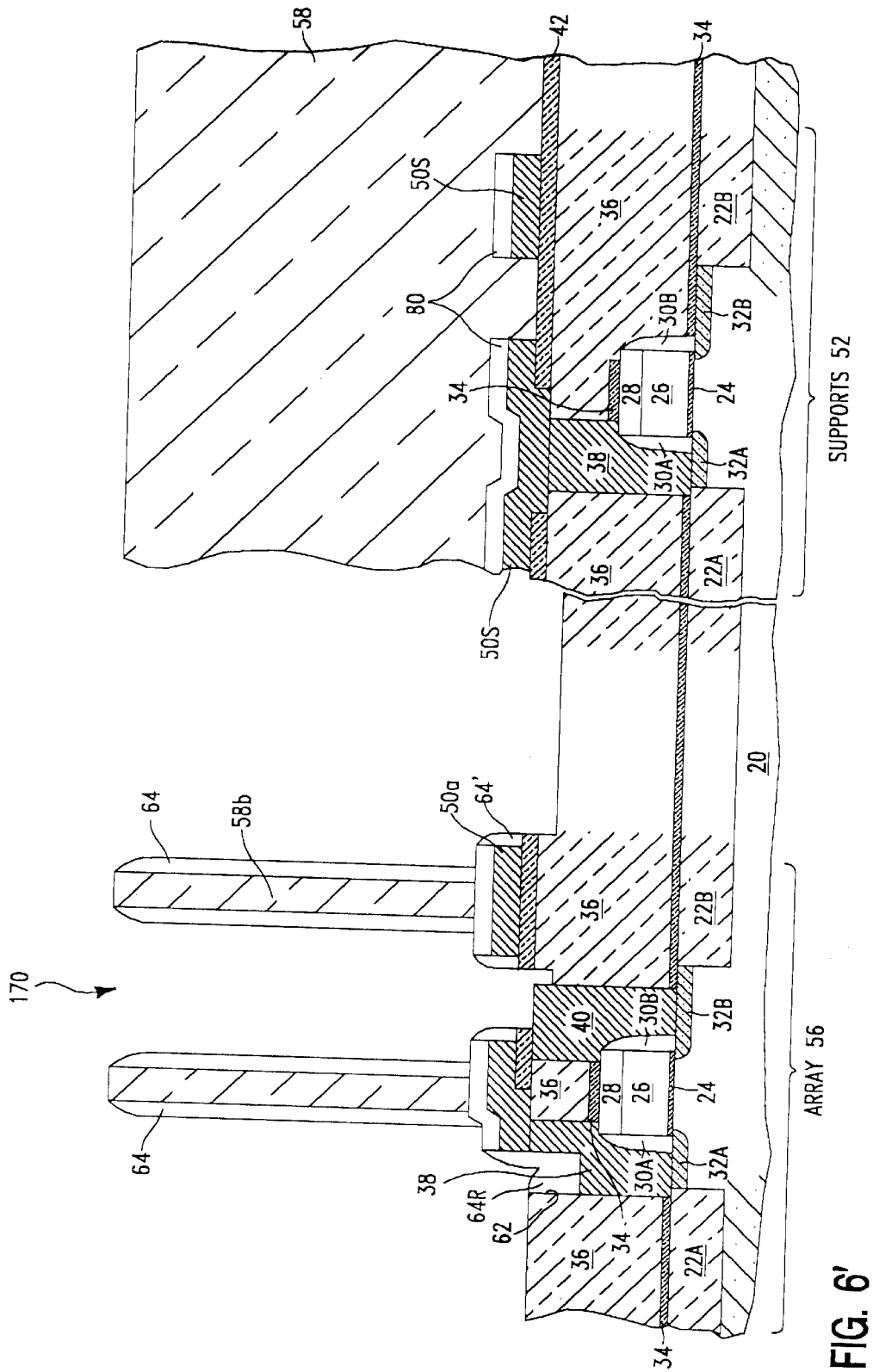

In the next step, shown in FIG. 6, bitline insulator 64 is then etched directionally (i.e., vertical to the substrate surface) by a suitable technique, such as RIE, leaving spacer insulator layer 64' exclusively on vertical surfaces, but removing it completely from horizontal surfaces. One important exception is recess 62 where insulator 64 is far too thick to be removed completely. This directional etch also opens up the portion of stud differentiation layer 42 that is over top surface 72 of capacitor stud 40. It may also etch into any portion of thick insulating layer 36 that is exposed adjacent capacitor stud 40 producing recess 74, as shown in FIG. 6. Conveniently, thick insulating layer 36, stud differentiating layer 42, and bitline insulating layer 64, 64' can all be formed of the same material, preferably silicon dioxide.

Spacer insulator 64' which remains after the etch performs two functions. First, it insulates sidewalls of bit-line 50a. Second, it fills (or partially fills) recess 62, protecting underlying bit-line stud 38 from being opened in the unmasked etch steps described above that could otherwise open contact to a storage capacitor node that will be applied subsequently.

To summarize, insulator 64 has been deposited with a thickness sufficient to fill recess 62, and then it has been thinned and spacer etched, leaving a thin coating of insulator 64' on sidewalls of thick insulating pedestals 58a and bitlines 50a, and leaving a substantial thickness of insulator 64R in recess 62 to prevent opening contact to bitline stud 38 while contact was simultaneously opened to node stud 40. The two contacts are thus differentiated without an additional masking step.

The present process leaves space 70 between thick insulating pedestals 58a for the node capacitor, a space that is about two spacers 64' less than a minimum dimension of the photolithographic system (neglecting bias from steps such as exposure and develop that can trade off the size of bitlines and bitline spaces). For a 256 Mb cell, the minimum photolithographic dimension is about 0.25 um and spacers 64' may be about 500 A thick, leaving about 1500 A for the width of the stacked capacitor. For a 1 Gb cell, the minimum photolithographic dimension is about 0.17 um. If spacers are about 500 A wide, then only about 700 A will be available for the width of the stacked capacitor. If the spacer dimension of the 1 Gb cell scales to about 300 A or less, as expected, at least about 1100 A will be available for the width of the stacked capacitor.

An enhancement to the process is described hereinbelow that permits significantly expanding space 70 for the node capacitor by narrowing thick insulating pedestals 58a.

In the enhanced process, shown in FIGS. 4', 5', and 6', a blanket layer of insulator 80, such as silicon nitride or alumina is deposited between bitline 50 and thick oxide 58. As shown in FIG. 4', in the array, after thick oxide 58 and insulator 80 have been etched, but before the etch proceeds through bitline metallization 50 to define bitlines 50a, thick insulating pedestals 58a are isotropically etched to form narrow thick oxide pedestals 58b, as shown in dotted outline. Insulator 80 is chosen to be substantially unaffected by this etch so bitlines 50a remain covered by insulator 80. Now the process of FIGS. 4, 5, and 6 is resumed. Bitlines 50 are directionally etched, this time defined by insulator 80, as shown in FIG. 5', and the etch continues so that recess 62 is formed as described hereinabove. As shown in FIG. 5' layer 64 is deposited and isotropically etched. Then, as shown in FIG. 6', layer 64 is directionally etched to provide spacers 64' on sidewalls of bitlines 50a and insulating pedestals 58b. Again, insulation is retained in recess 62 over bitline stud 38 while opening contact to node contact stud 40. This embodiment has the advantage that space 170 available for a stacked capacitor is nearly double space 70 available in the embodiment of FIG. 6.

At this point, a very desirable interim-structure for further construction of the stacked capacitor has been prepared. Local connections in support regions are in place without the structure or complication of process steps used for the array. Wordlines 26 and bitlines 50a are in place, as are bitline studs 38 and capacitor studs 40, with appropriate isolation between the various elements. Contact between bitline 50a and bitline stud 38 has been achieved while bitline 50a and bitline stud 38 are protected by spacer 64' and by the presence of self-aligned recess 62, filled or partially filled with insulator 64R. Capacitor stud 40 is exposed for eventual connection to an overlying storage node capacitor. Locations for the storage node capacitors have been prepared between thick insulating pedestals 58a (FIG. 6) or 58b (FIG. 6'), and once capacitors are so located, the structure will provide a substantially planarized surface. Furthermore, as shown in FIG. 6', the dimensions of the node capacitor can be increased to virtually the entire size of the cell by substantially reducing the dimensions of thick insulating pedestals 58a to the spacer-like dimensions of thick insulating pedestals 58b. All this has been achieved without any additional masking steps or unconventional process steps.

Figure 7:
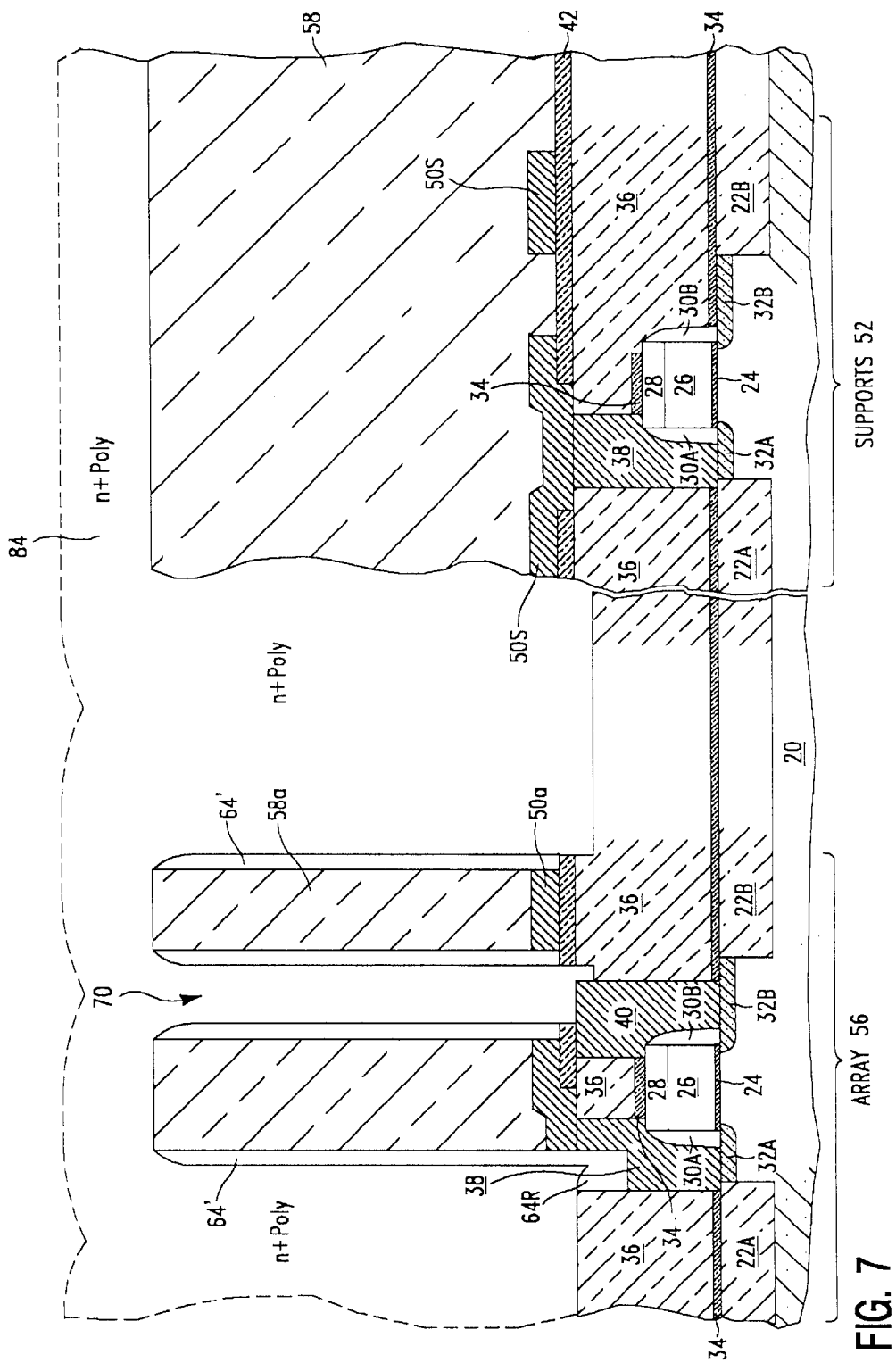

In the next steps, shown in FIGS. 7 to 12, a stacked capacitor is formed in opening 70 of FIG. 6 (or equivalently in opening 170 of FIG. 6'). As shown in FIG. 7, a layer of a selectively etchable material, such as n+ doped polysilicon 84, is first conformally deposited by a process such as CVD, with a thickness sufficient to fill all openings in array 56. Thus n+ polysilicon layer 84 has a thickness of at least about 4000 A. Then n+ polysilicon layer 84 is chemical-mechanical polished, stopping on thick insulator 58 and thick insulating pedestals 58a.

Figure 8A:
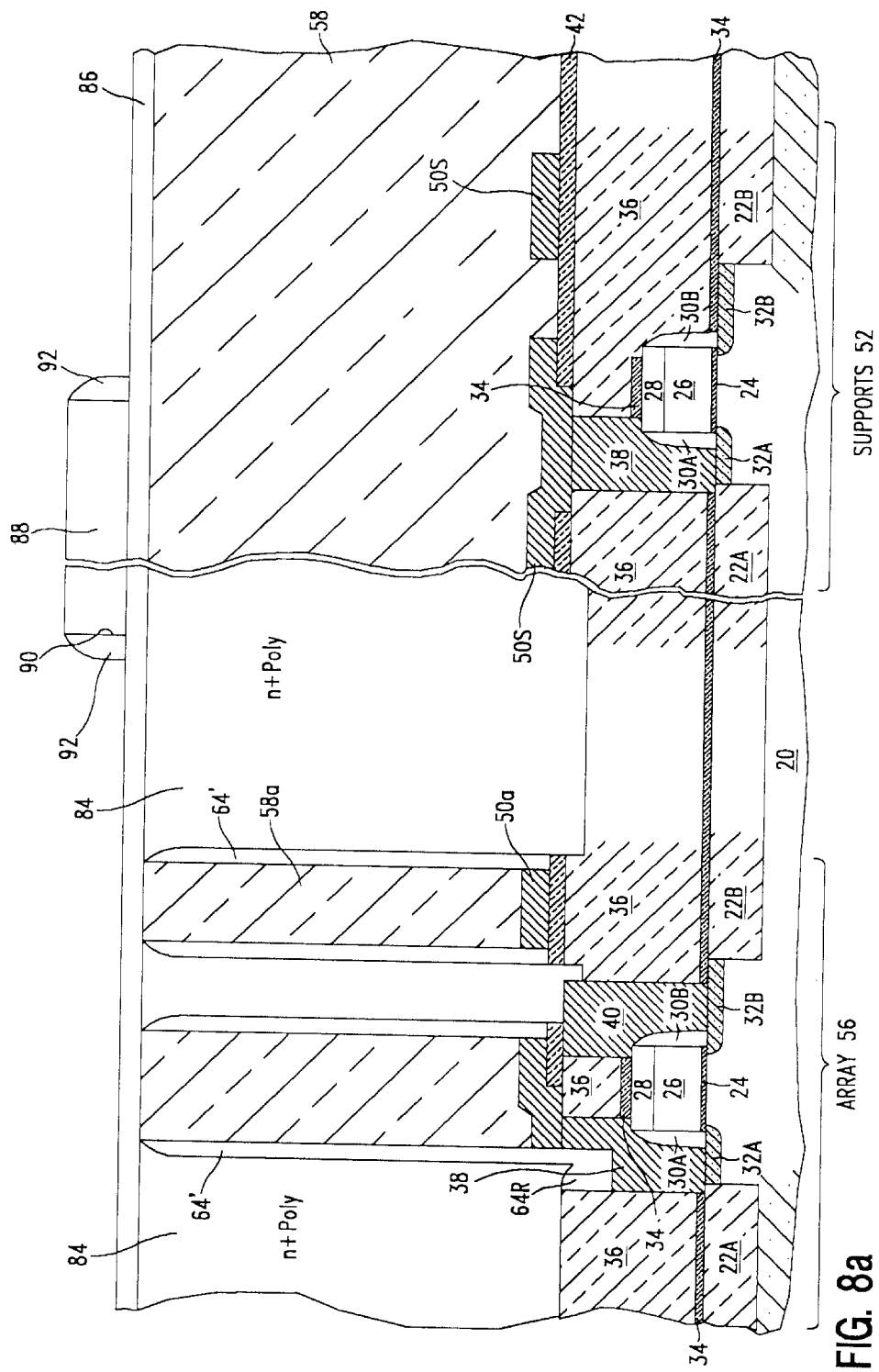
Figure 8B:
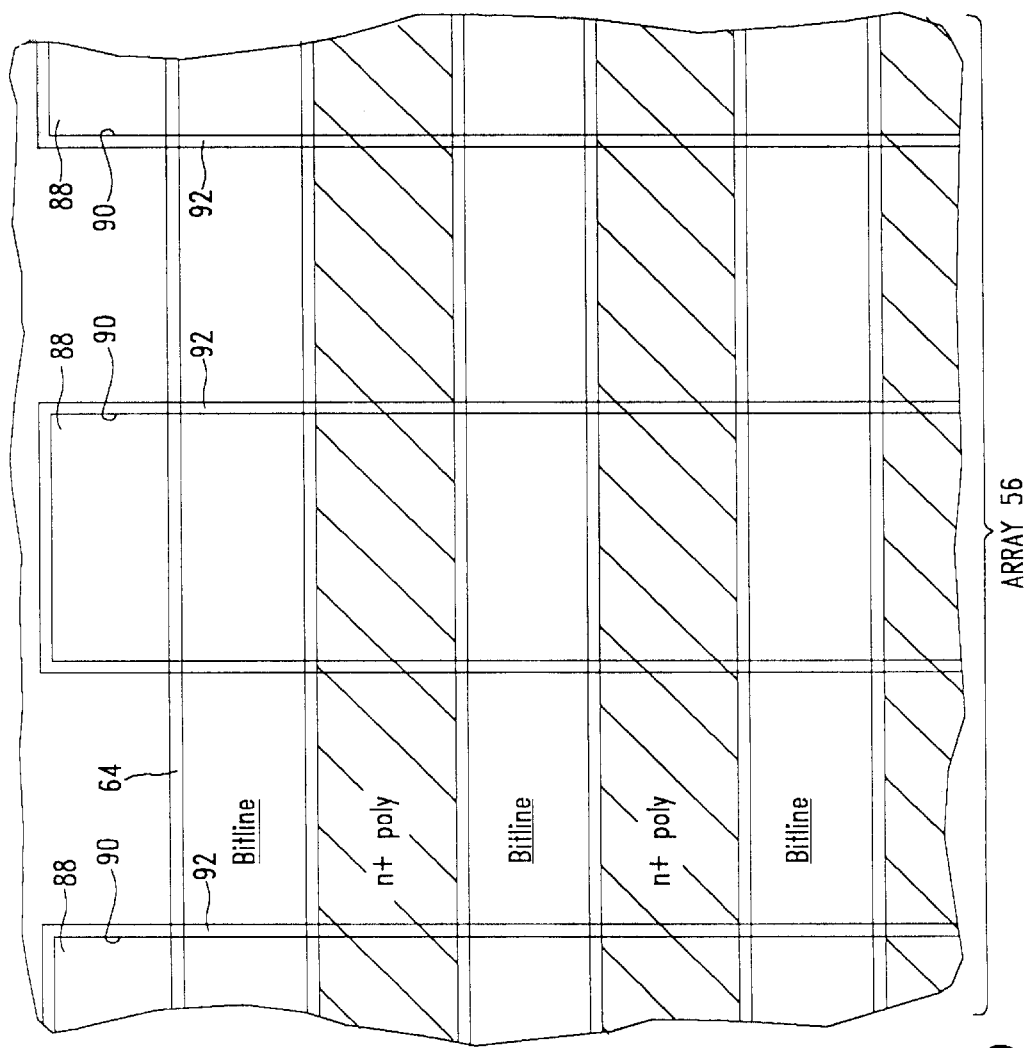
FIG. 8b is a top view of the layout of the array portion of the chip of the present invention at the step in the process illustrated in FIG. 8a showing the location of spacers that define the separation of stacked capacitors from each other.
Figure 9:
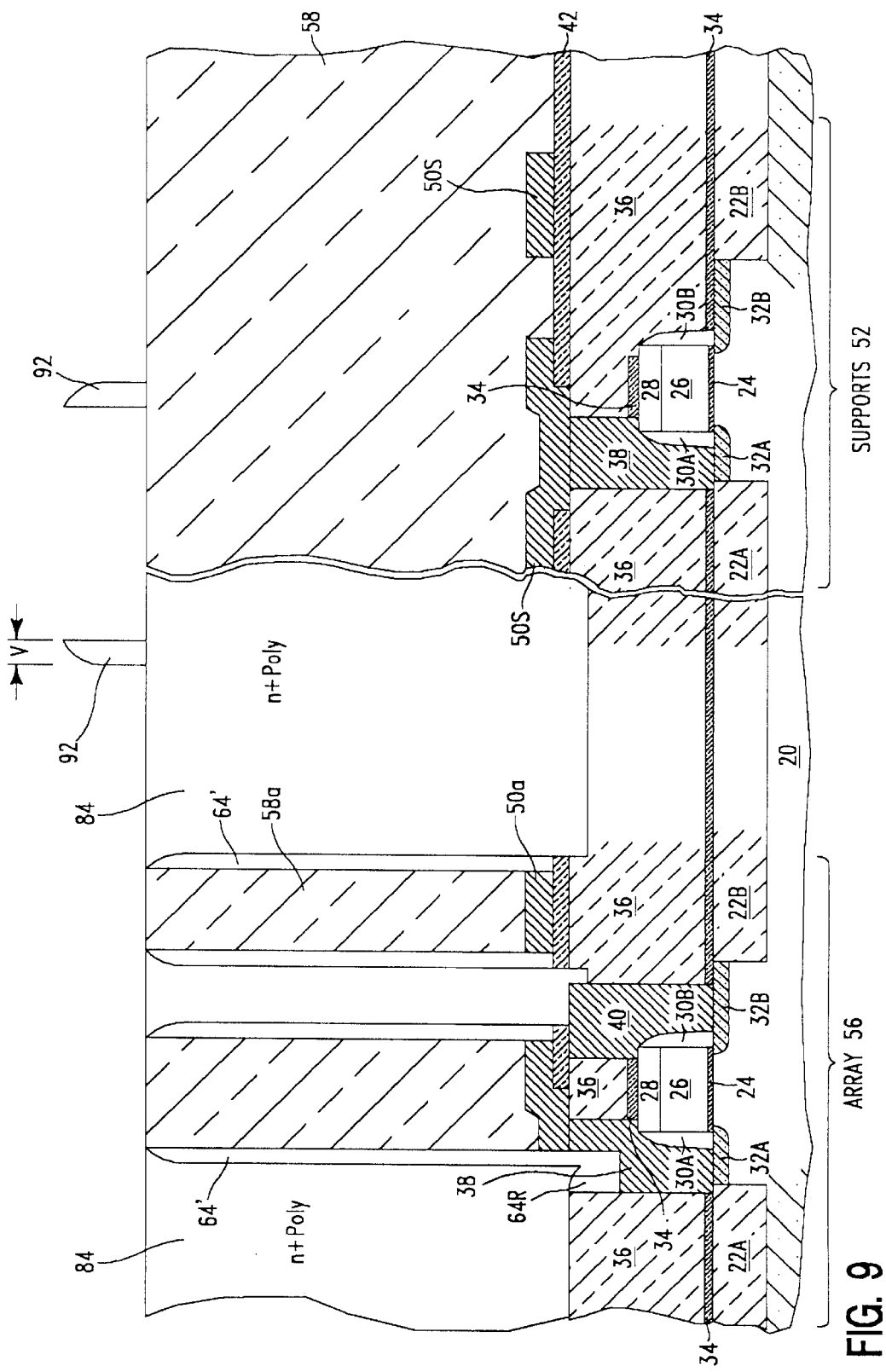

Then, as shown in FIG. 8a, thin blanket CVD silicon nitride layer 86 is deposited having a thickness of about 500 A. A blanket CVD oxide layer about 2500 A thick, is then deposited, and this layer is then masked with resist and etched, stopping on nitride layer 86, to provide spaced apart oxide islands 88 having edge 90, as shown in the cross sectional view of FIG. 8a and in the top view of FIG. 8b. Then another thin layer of silicon nitride, about 500 to 1000 A thick, is conformally deposited. This nitride is directionally etched with a time set to remove the nitride layer from the top surface of oxide island 88 while leaving nitride spacers 92 alongside edge 90 of oxide islands 88. In addition, the etch is controlled to leave most of blanket nitride layer 86 intact, and this is achievable since etch uniformity in the vertical direction across an 8 inch wafer is usually within about 10%. Of course, the thicknesses of the nitride layers can be adjusted to ensure that a sufficient thickness of nitride layer 86 remains. Oxide island 88 is then itself etched in buffered HF leaving nitride spacers 92 standing alone while nitride layer 86 protects thick oxide 58. The directional etch is then resumed to remove all horizontal portions of nitride 86 while leaving spacers 92 intact as shown in FIG. 9. Nitride spacers 92 define the separation between individual stacked capacitors in the direction parallel to wordlines 26.

Figure 10:
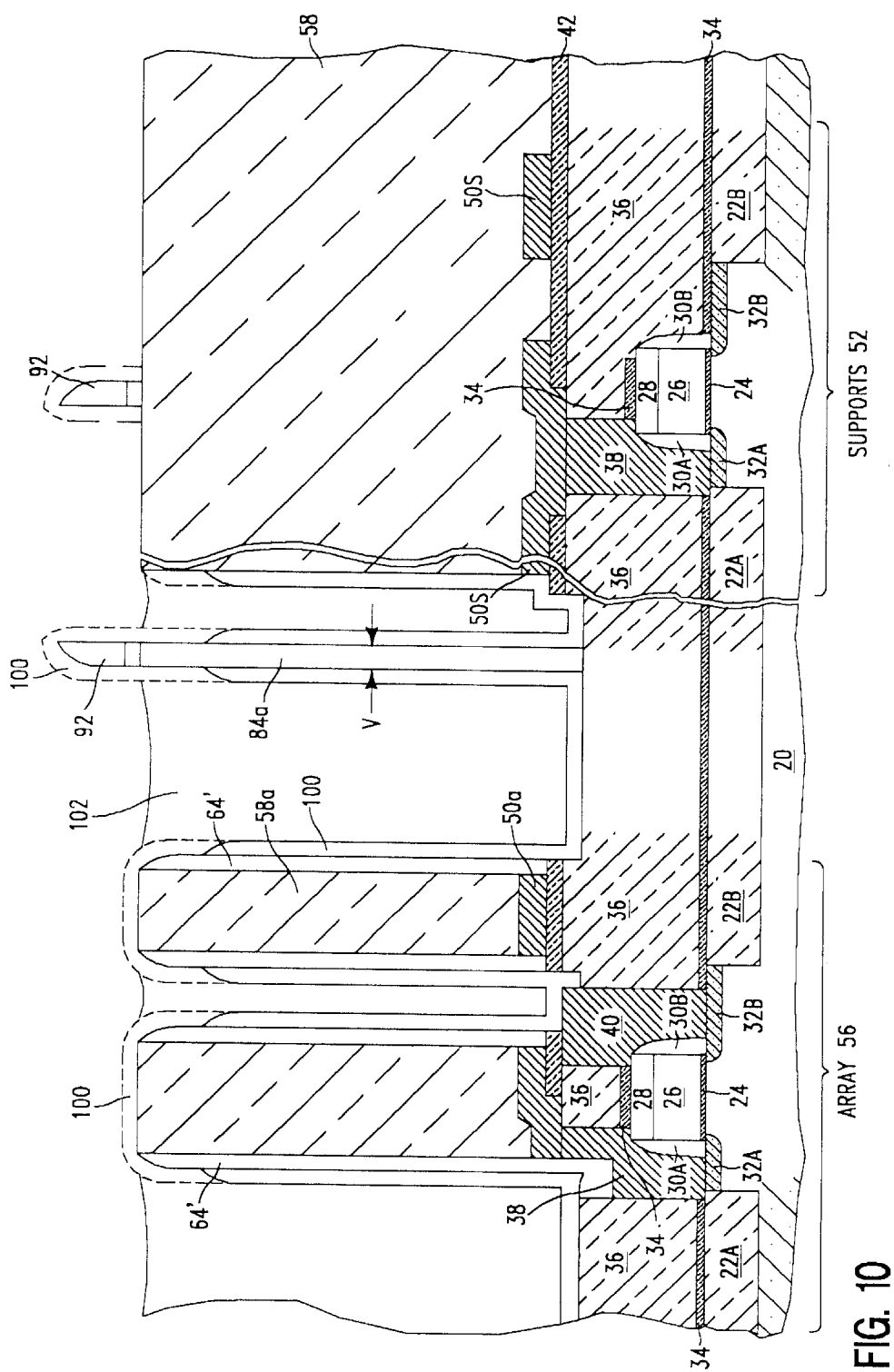

In the next step, shown in FIG. 10, n+ polysilicon 84 is directionally etched in a standard etchant, such as HBr+He+O$_2$ or Cl$_2$+HBr+He+O$_2$, masked only by nitride spacer 92, leaving spacer-width n+ polysilicon mandrel 84a. A thin layer of p+ polysilicon 100 is then deposited by CVD. Resist 102 is then applied, filling all remaining crevices. A plasma is then used to etch back resist 102 approximately to the surface of thick insulator 58, 58a, exposing p+ polysilicon 100 on oxide 58, 58a, and on spacers 92. p+ polysilicon 100 is then isotropically etched and recessed to a level below the surface of thick insulator 58, 58a. Nitride spacers 92 and resist 102 are then removed.

Figure 11A:
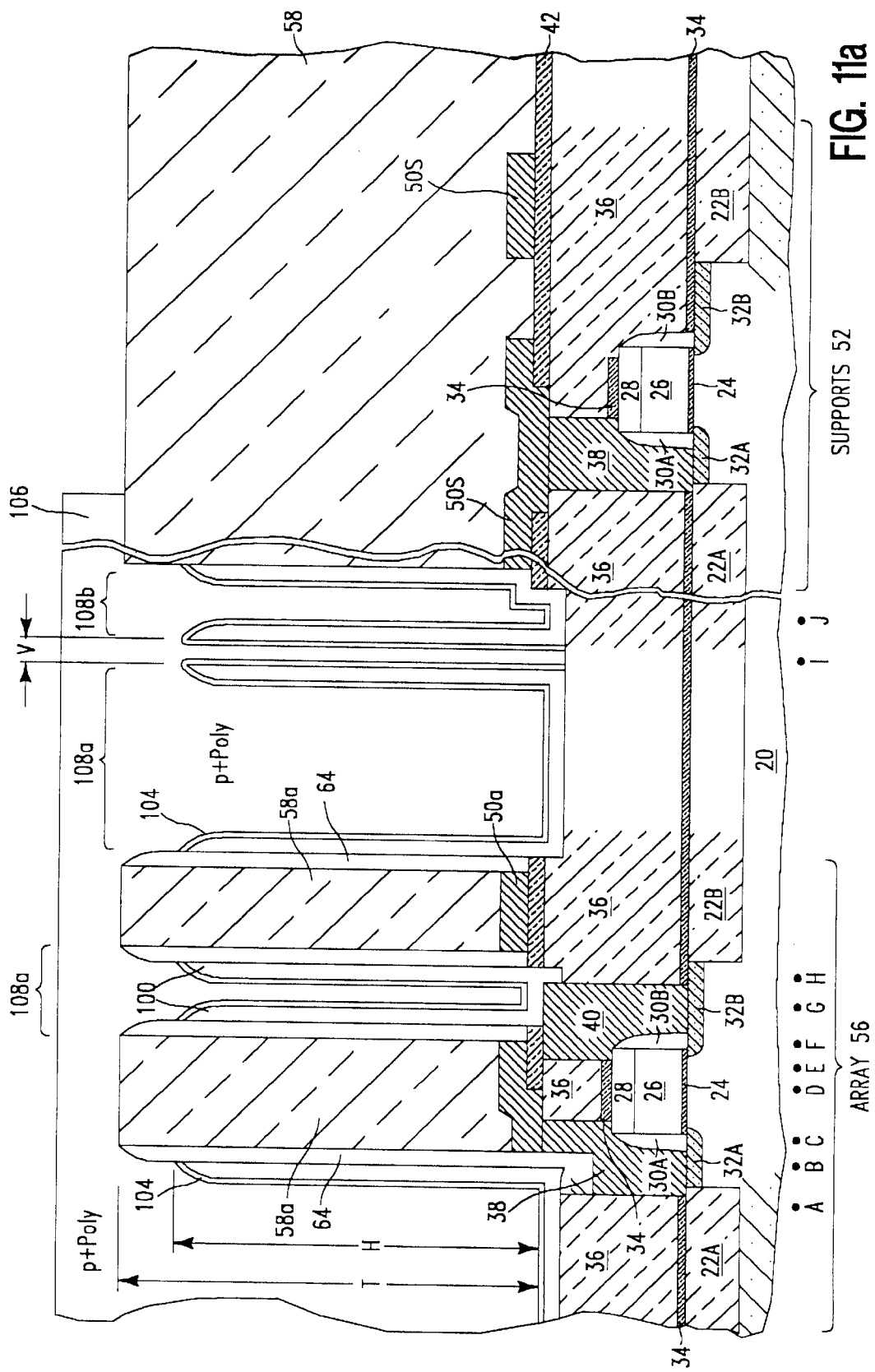

Then, as shown in FIG. 11a, n+ polysilicon mandrel 94 is removed by wet etch in an etchant such as hot H$_3$PO$_4$, a process that does not attack thin layer of p+ polysilicon 100 or oxide regions 58. The use of H$_3$PO$_4$ to selectively etch n+ doped silicon is described in an article in the IBM Technical Disclosure Bulletin, "Hole Opening in Polysilicon by Selective Doping and Removal Technique," by R. F Bartholomew, et al, IBM TDB, May, 1981, pages 5346–5347. Exposed surfaces of thin layer of p+ polysilicon 100 are then oxidized or nitridized for capacitor dielectric 104. Plate layer of p+ polysilicon 106 is then deposited. Plate layer 106 is then planarized, masked over the array regions, and etched elsewhere to complete stacked capacitor 108 of the DRAM cell. It is seen that stacked capacitor 108 has a height H that is approximately equal to the thickness T of thick insulating pedestal 58a. It is also seen that stacked capacitor 108a is spaced from stacked capacitor 108b by a distance V that is about equal to the width V of spacer 92 (FIG. 10) and to the width V of n+ polysilicon mandrel 84a. Formed by a non-photolithographic process, spacer 92 has a width that is substantially smaller than the minimum photolithographic dimension of the system used for fabricating other structures, and hence, the spacing between capacitors is also substantially smaller than this minimum photolithographic dimension.

Figure 11B:
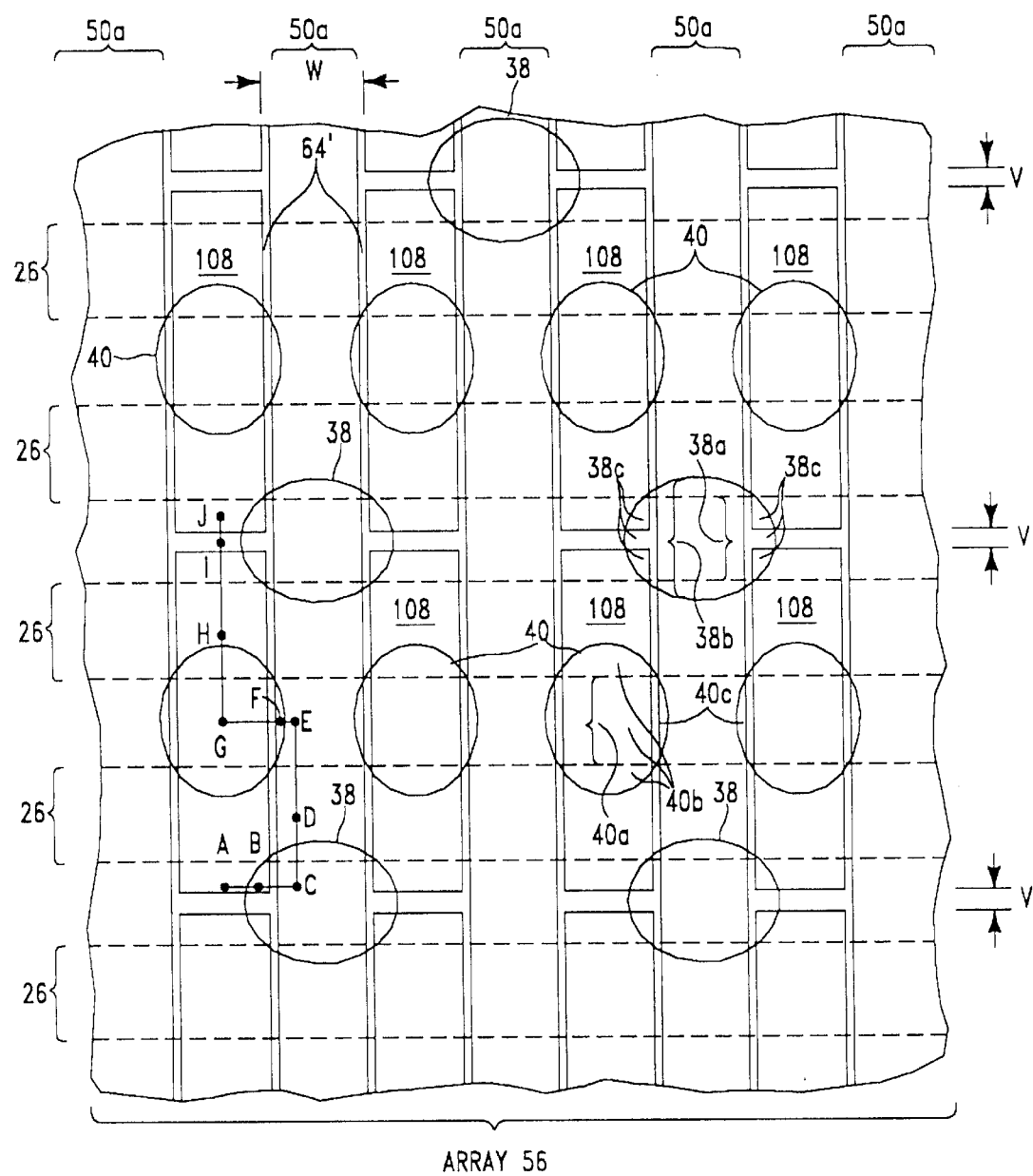
FIG. 11b is a top view of the layout of the array portion of the chip of the present invention showing the location of stacked capacitors self-aligned to bitlines and separated from each other in the direction parallel to the bitline by a distance that is less than the minimum photolithographic dimension.
Figure 11B:
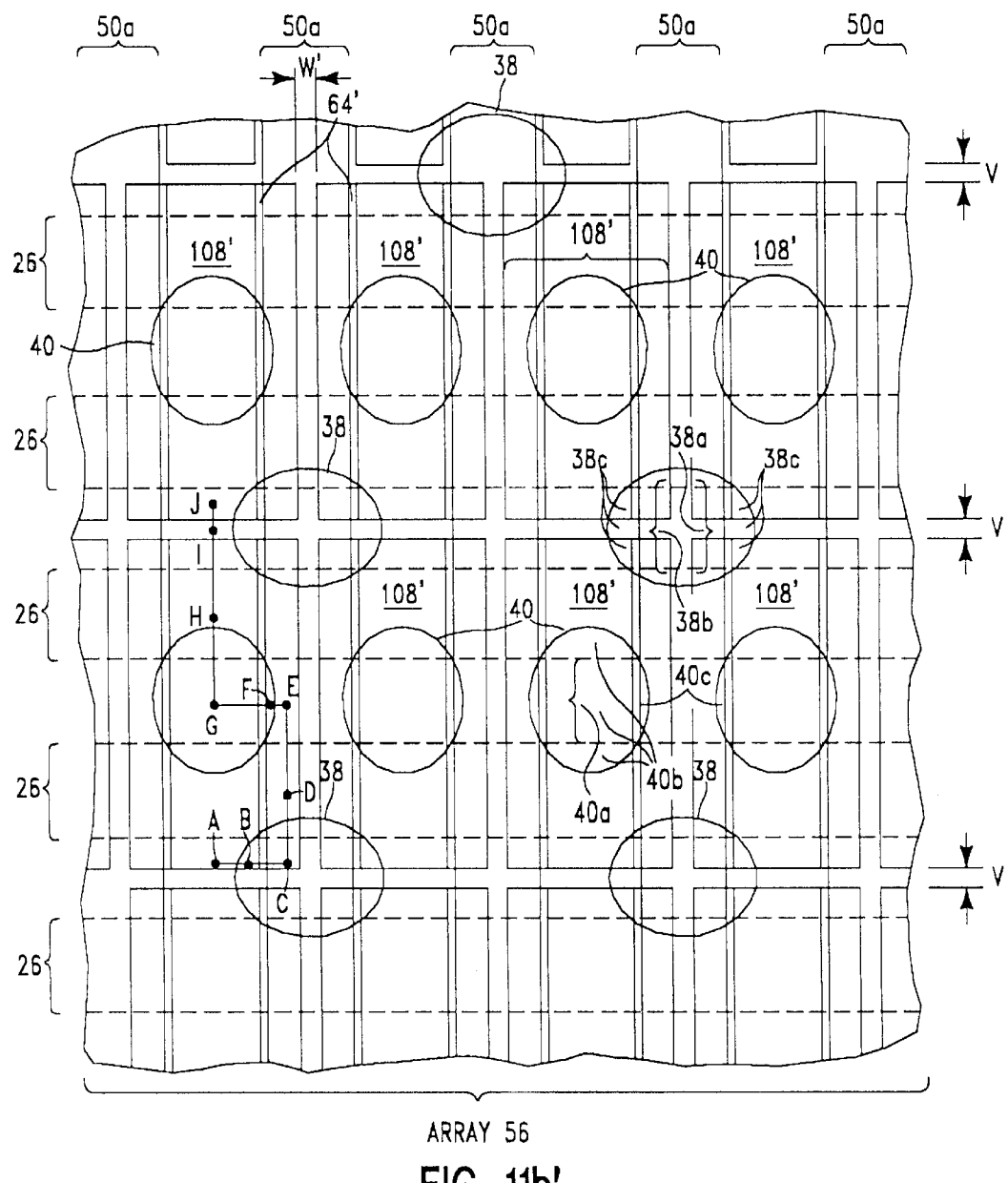

In FIG. 11b, bitline stud 38 has region 38a where stud 38 is over and makes contact to bitline diffusion 32a between wordlines 26. Bitline stud 38 also has region 38b where stud 38 is under and makes contact to bitline 50a. Bitline stud 38 also has region 38c where recess 62 is located in stud 38 where bitline stud 38 extends beyond bitline 50a. Similarly, stacked capacitor stud 40 has region 40a where stud 40 makes contact to node diffusion 32b between wordlines 26. Stacked capacitor stud 40 also has region 40b where stud 40 makes contact to stacked capacitor 108. Stacked capacitor stud 40 also has region 40c where stud 40 is under bitline 50a and is insulated therefrom by stud differentiation layer 42.

FIG. 11a is a cross section along irregular path A, B, C, . . . J of the top view of the cell layout shown in FIG. 11b. The cross sectional views in FIGS. 1 to 11a are along this irregular path to show as many features as possible in a single drawing. For clarity in interpreting the cross section, points corresponding to A, B, C . . . J in the top view are also shown in the cross section. Wordlines 26, bitlines 50a, bitline spacers 64', bitline contact studs 38, stacked capacitor studs 40 and stacked capacitors 108 are all shown in the top view.

FIG. 11b' is a top view of the enhanced version of the cell described in FIGS. 4', 5', and 6', in which capacitors are significantly larger because they extend over the bitlines and are separated from each other by a distance W' that is less than the photolithographic minimum dimension over the bitlines. By contrast, in FIG. 11b it is seen that stacked capacitors 108 are separated from each other by a distance W that is equal to the width of bitline 50a plus two spacers 64', which adds up to a distance that is greater than the photolithographic minimum dimension.

While several embodiments of the invention, together with modifications thereof, have been described in detail herein and illustrated in the accompanying drawings, it will be evident that various further modifications are possible without departing from the scope of the invention. For example, a wide range of insulators and conductors known in the art can be used for the various layers. Nothing in the above specification is intended to limit the invention more narrowly than the appended claims. The examples given are intended only to be illustrative rather than exclusive.

What is claimed is:

1. A semiconductor chip comprising a memory cell comprising a stacked capacitor, a bitline, a spacer, and a memory cell diffusion, said stacked capacitor comprising a plate connected to said memory cell diffusion, wherein a first edge of the spacer is adjacent the bitline and a second edge of the spacer is adjacent the plate, wherein the bitline and the plate are separated by a predetermined thickness of the spacer, and further wherein said stacked capacitor has a height and said bitline has a thickness, said height being at least 5 times said thickness.

2. A semiconductor chip as recited in claim 1, further comprising thick insulation on said bitline, said bitline being self-aligned to said thick insulation, said stacked capacitor plate being self-aligned to said thick insulation and to said bitline.

3. A semiconductor chip as recited in claim 2, wherein said thick insulation has a thickness and said bitline has a thickness, said thick insulation thickness being at least 5 times said bitline thickness.

4. A semiconductor chip as recited in claim 2, wherein said thick insulation in said memory cell is exclusively on said bitline.

5. A semiconductor chip as recited in claim 4, wherein said thick insulation is centered on said bitline and narrower than said bitline.

6. A semiconductor chip as recited in claim 2, wherein said thick insulation has a thickness and said stacked capacitor has a height, said height being about equal to said thickness.

7. A semiconductor chip as recited in claim 2, wherein said bitline and stacked capacitor are part of an array, said chip further comprising supports circuits, said support circuits comprising an interconnect metallization layer coplanar with said bitline, said thick insulation on said interconnect metallization layer to provide a substantially uniform chip topology.

8. A semiconductor chip as recited in claim 7, wherein said bitline and said coplanar interconnect metallization layer have a mask alignment tolerance spacing variation therebetween.

9. A semiconductor chip as recited in claim 1, wherein a second layer is between said bitline and said thick insulation, said thick insulation being etchable without substantially etching said second layer, said second layer being etchable without substantially etching said bitline.

10. A semiconductor chip as recited in claim 9, wherein said bitline is self-aligned to said second layer.

11. A semiconductor chip as recited in claim 2, wherein said plate does not extend over said thick insulation.

12. A semiconductor chip as recited in claim 2, wherein said plate comprises a contact to a first stud.

13. A semiconductor chip as recited in claim 12, wherein said contact is self aligned to said bit line.

14. A semiconductor chip as recited in claim 1, wherein said bitline comprises a contact to a second stud.

15. A semiconductor chip as recited in claim 14, wherein said contact is self aligned to said bitline.

16. A semiconductor chip as recited in claim 14, wherein said second stud has an edge self aligned to said bitline.

17. A semiconductor chip as recited in claim 14, further comprising a recess in said second stud adjacent said edge.

* * * * *